US 6,680,685 B2

(12) United States Patent
Nozaki

(10) Patent No.: US 6,680,685 B2
(45) Date of Patent: *Jan. 20, 2004

(54) CHOPPER ANALOG-TO-DIGITAL CONVERTER WITH POWER SAVING MODE

(75) Inventor: Hirohide Nozaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/125,479

(22) Filed: Apr. 19, 2002

(65) Prior Publication Data
US 2003/0080892 A1 May 1, 2003

(30) Foreign Application Priority Data
Oct. 29, 2001 (JP) ........................ 2001-331132

(51) Int. Cl.⁷ ............................... H03M 1/36
(52) U.S. Cl. ....................... 341/158; 341/155
(58) Field of Search ................. 341/155, 156, 341/158, 159

(56) References Cited

U.S. PATENT DOCUMENTS 5,952,951 A * 9/1999 Fujino ....................... 341/159
6,281,831 B1 * 8/2001 Shou et al. ................. 341/159
6,459,399 B1 * 10/2002 Nozaki ...................... 341/155

FOREIGN PATENT DOCUMENTS

| JP | 61-046614 A | * 3/1986 | ............ H03M/1/46 |
| JP | 5-240887 | 9/1993 | |
| JP | 7-273616 | 10/1995 | |
| JP | 8-46495 | 2/1996 | |
| JP | 10-322210 A | * 12/1998 | ............ H03M/1/34 |

* cited by examiner

Primary Examiner—Howard L. Williams
(74) Attorney, Agent, or Firm—Leydig, Voit & Mayer, Ltd.

(57) ABSTRACT

A chopper type analog-to-digital converter has a comparator. The comparator includes an inverter circuit, a capacitor connected to an input terminal of the inverter circuit, a first switch and a second switch for alternately supplying the capacitor with a reference voltage and an analog input voltage, and a switch (inverter switch) for short-circuiting the input terminal and output terminal of the inverter circuit, and produces an output signal from the inverter circuit by controlling these switches in predetermined timing. To bring the comparator into the power saving mode, selectors supply the comparator with a power supply voltage and a ground potential as the reference voltage and analog input voltage, and a controller halts control of the first switch and second switch and the inverter switch when the output signal of the inverter circuit is placed at the ground potential. The chopper type A/D converter can reduce the power consumption and prevent the degradation in the accuracy.

7 Claims, 4 Drawing Sheets

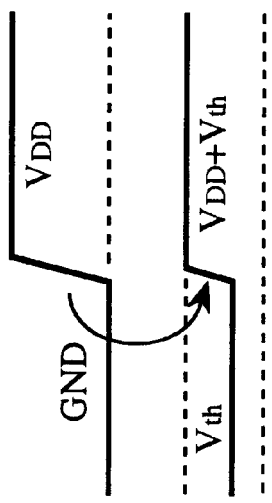
FIG.2A
FIG.2B
FIG.2C
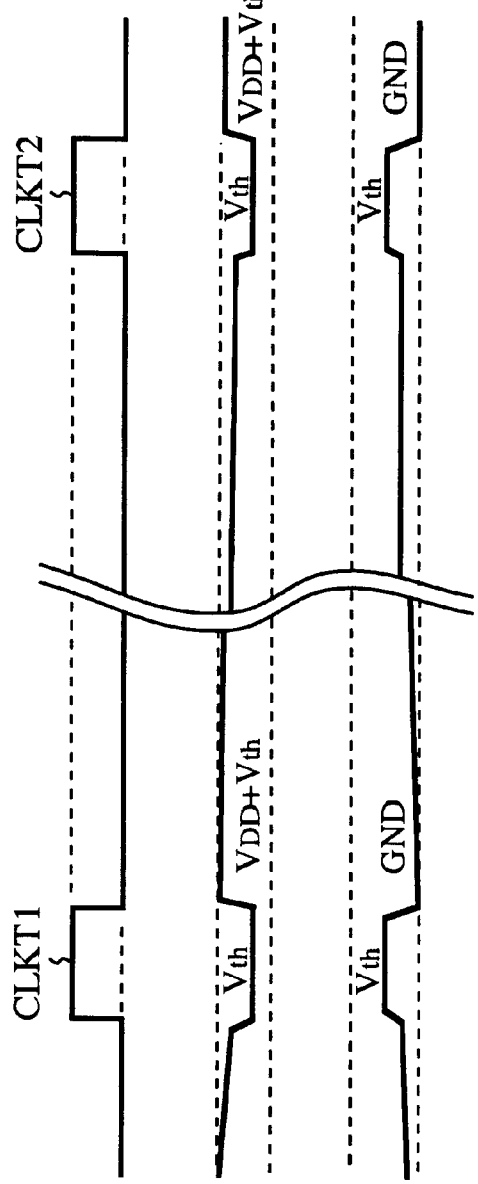
FIG.3A
FIG.3B
FIG.3C

FIG.5 (PRIOR ART)
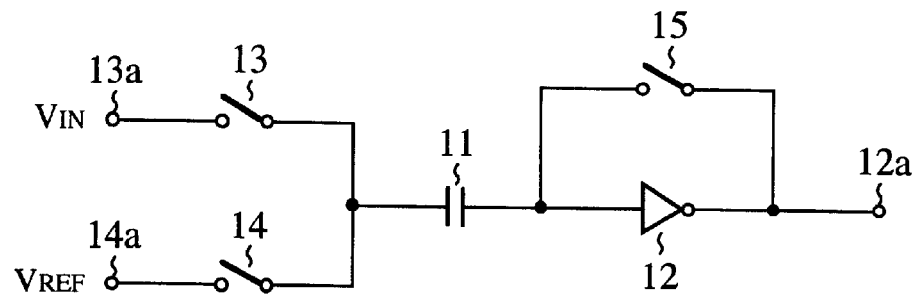
FIG.6 (PRIOR ART)
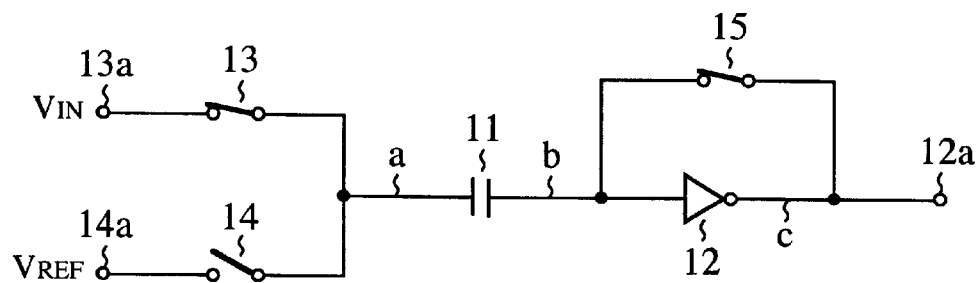
FIG.7A (PRIOR ART)
FIG.7B (PRIOR ART)
FIG.7C (PRIOR ART)
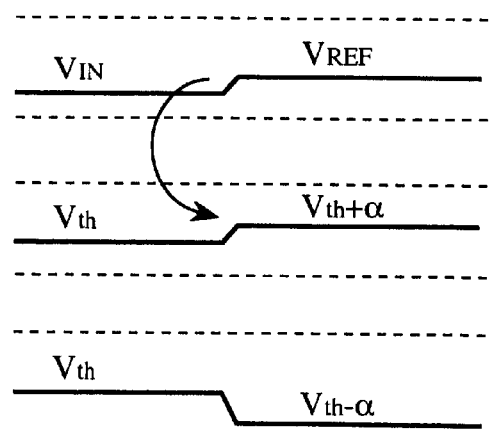

CHOPPER ANALOG-TO-DIGITAL CONVERTER WITH POWER SAVING MODE

BACKGROUND OF THE INVENTION

1. Field of the Invention

The present invention relates to a chopper type analog-to-digital (A/D) converter.

2. Description of Related Art

FIG. 5 is a circuit diagram showing a configuration of a comparator used by a conventional chopper type A/D converter. In this figure, the reference numeral 11 designates a capacitor, 12 designates an inverter circuit, and 13–15 each designate an analog switch. A first end (left-side end) of the capacitor 11 is connected to an analog input signal terminal (analog input terminal) 13a via the analog switch 13, and to a reference signal input terminal (reference input terminal) 14a via the analog switch 14. Thus, the capacitor 11 is alternately supplied with an analog input signal (analog input voltage $V_{IN}$) and a reference signal (reference voltage $V_{REF}$) at a timing described later. The inverter circuit 12 is connected in parallel with the analog switch 15, and an end of the inverter circuit 12 is connected to an output terminal 12a. The analog switches 13–15 undergo on-off control at a timing described later.

Next, the operation of the conventional chopper type A/D converter will be described with reference to FIGS. 6–8.

First, when the analog switches 13 and 15 are turned on and the analog switch 14 is turned off at a first timing point of a clock signal (see, FIG. 6), the first end of the capacitor 11 (point a) is supplied with the analog voltage $V_{IN}$. As a result, the input side potential of the capacitor 11 (potential at the point a) rises to the level of the analog voltage $V_{IN}$ as illustrated in FIG. 7(a). On the other hand, since the analog switch 15 is placed at the ON state, the potential of a second end of the capacitor 11 (the potential at point b) is equal to the threshold voltage $V_{th}$ of the inverter circuit 12 as illustrated in FIG. 7(b). Thus, the capacitor 13 is charged to the level corresponding to the difference between the $V_{IN}$ and $V_{th}$. In this case, the level of the output side (point C) of the inverter circuit 12 is placed at the threshold voltage $V_{th}$.

Subsequently, when the analog switches 13 and 15 are turned off and the analog switch 14 is turned on as illustrated in FIG. 8 at a second timing point of the clock signal, the first end of the capacitor 11 (point a) is supplied with the reference voltage $V_{REF}$. As a result, the input side potential of the capacitor 11 (potential at the point a) is brought to the level of the reference voltage $V_{REF}$ as illustrated in FIG. 7(a). In the example as shown in FIG. 7, the reference voltage $V_{REF}$ is greater than the analog input voltage $V_{IN}$. Accordingly, the potential at the second end (point b) of the capacitor 11 exceeds the threshold voltage $V_{th}$ to the level $V_{th}+\alpha$ ($\alpha = V_{REF} - V_{IN}$) as illustrated in FIG. 7(b). As a result, the output side (point C) of the inverter circuit 12 is placed at the low level (FIG. 7(c)).

When the analog switches 13 and 15 are turned on and the analog switch 14 is turned off again at a third timing point of the clock signal, the first end of the capacitor 11 (point a) is supplied with the analog voltage $V_{IN}$. As a result, the capacitor 11 is charged to the level corresponding to the $V_{IN} - V_{th}$.

Subsequently, when the analog switches 13 and 15 are turned off and the analog switch 14 is turned on at a fourth timing point of the clock signal, the first end of the capacitor 11 is supplied with the reference voltage $V_{REF}$. When the reference voltage $V_{REF}$ is less than the analog input voltage $V_{IN}$, the potential at the point b falls below the threshold voltage $V_{th}$ to the level of $V_{th}-\alpha$, thereby placing the output side (point C) of the inverter circuit 12 at a high level.

As described above, the analog voltage $V_{IN}$ and the reference voltage $V_{REF}$ are alternately supplied to the capacitor 11 by the on-off control of the analog switches 13 and 14, so that the analog voltage $V_{IN}$ is compared with the reference voltage $V_{REF}$ by the on-off control of the analog switch 15, and the inverter output signal is produced from the output terminal 12a.

However, the chopper type comparator as shown in FIG. 5 has a problem of imposing large power consumption on the A/D converter. This is because the potential changes of $V_{th} \pm \alpha$ at the second end (point b) of the capacitor 11 inevitably brings about the flow-through current (the current flowing through the two transistors of the CMOS inverter) of the inverter circuit 12 in the power-save mode.

To prevent the foregoing problem to save power, a chopper type comparator as shown in FIG. 9 is proposed. In FIG. 9, the same components as those of FIG. 5 are designated by the same reference numerals (although the analog switches 13 and 14 are omitted in FIG. 9). In FIG. 9, the second end (point b) of the capacitor 11 is grounded through a switch 16 to bring the input side of the inverter circuit 12 to the ground potential (L level) forcibly. Thus, the input side of the inverter circuit 12 is forcibly placed at the ground potential when the switch 16 is brought to the ON state while the analog switch 15 is at the OFF state, and neither the analog input voltage $V_{IN}$ or the reference voltage $V_{REF}$ is applied, thereby preventing the flow-through current of the inverter circuit 12. The prevention of the flow-through current can also be achieved by placing the input side of the inverter circuit at the power supply voltage ($V_{DD}$) instead of placing the input side of the inverter circuit 12 at the ground potential.

The conventional chopper type comparator with the foregoing configuration comprises the switch 16 for forcibly bringing the input side of the inverter circuit 12 to the ground potential. It causes the charges stored in the capacitor 12 to flow through the switch 16, thereby changing the potential at the second end (point b) of the capacitor 11. In other words, the switch 16, operating as a capacitive component, changes the potential at the point b. As a result, applying the chopper type comparator as shown in FIG. 9 to the A/D converter presents a problem of degrading the accuracy of the A/D converter.

SUMMARY OF THE INVENTION

The present invention is implemented to solve the foregoing problems. It is therefore an object of the present invention to provide a chopper type A/D converter capable of reducing the power consumption and preventing degradation in the accuracy.

According to a first aspect of the present invention, there is provided a chopper type analog-to-digital converter having a comparator that includes an inverter circuit, a capacitor connected to an input terminal of the inverter, first switching means for supplying the capacitor with a reference voltage and an analog input voltage alternately, and second switching means for short-circuiting the input terminal of the inverter and an output terminal of the inverter, and that outputs an inverter output signal from the output terminal of the inverter in response to control of the first and second switching means, the chopper type analog-to-digital converter comprising: selecting means for supplying, when bringing the comparator into a power saving mode, the first switching means with one of a power supply voltage and a ground potential as the reference voltage, and with the other of the power supply voltage and the ground potential as the analog input voltage; and control means for halting control of the first and second switching means when the inverter output signal is placed at one of the ground potential and the power supply voltage.

Here, the first switching means may comprise a first switch connected to the capacitor, and a second switch connected to the capacitor; the selecting means may comprise a first selector for selectively supplying the first switch with one of the power supply voltage and the reference voltage, and a second selector for selectively supplying the second switch with one of the ground potential and the analog input voltage; and the control means may control, when bringing the comparator into the power saving mode, the first and the second selector such that they supply the first switch and the second switch with the power supply voltage and the ground potential, respectively.

The first switch and the second switch may be turned on and off alternately, and the second switching means may be turned on and off in response to the ON/OFF control of the first switch and the second switch.

The second switch may be turned off when the first switch and the second switching means are turned on, and the second switch may be turned on when the first switch and the second switching means are turned off.

The control means may supply the capacitor with one cycle of the ground potential and the power supply voltage each time a prescribed time has elapsed after starting the power saving mode by controlling the first switching means and the second switching means at predetermined timing.

The prescribed time may be determined in accordance with a leakage current of transistors constituting the inverter circuit and with an amount of charge the capacitor stores.

According to a second aspect of the present invention, there is provided a chopper type analog-to-digital converter having a plurality of comparators, each of which includes an inverter circuit, a capacitor connected to an input terminal of the inverter, first switching means for supplying the capacitor with a reference voltage and an analog input voltage alternately, and second switching means for short-circuiting the input terminal of the inverter and an output terminal of the inverter, and outputs an inverter output signal from the output terminal of the inverter in response to control of the first and second switching means, the chopper type analog-to-digital converter comprising: selecting means for supplying, when bringing each of the comparators into a power saving mode, the first switching means with one of a power supply voltage and a ground potential as the reference voltage, and with the other of the power supply voltage and the ground potential as the analog input voltage in each of the comparators; and control means for halting control of the first and second switching means of each of the comparators when the inverter output signal of each of the comparators is placed at one of the ground potential and the power supply voltage.

BRIEF DESCRIPTION OF THE DRAWINGS

FIG. 2 is a timing chart illustrating a power-saving operation of the chopper type A/D converter as shown in FIG. 1;

FIG. 3 is a timing chart illustrating a power-saving control of the chopper type A/D converter as shown in FIG. 1;

FIG. 5 is a circuit diagram showing a configuration of a conventional chopper type A/D converter;

FIG. 6 is a circuit diagram showing ON/OFF control of switches in the chopper type A/D converter as shown in FIG. 5;

FIG. 7 is a timing chart illustrating the operation of the chopper type A/D converter as shown in FIG. 5;

DETAILED DESCRIPTION OF THE PREFERRED EMBODIMENTS

The invention will now be described with reference to the accompanying drawings.

Embodiment 1

Figure 1:
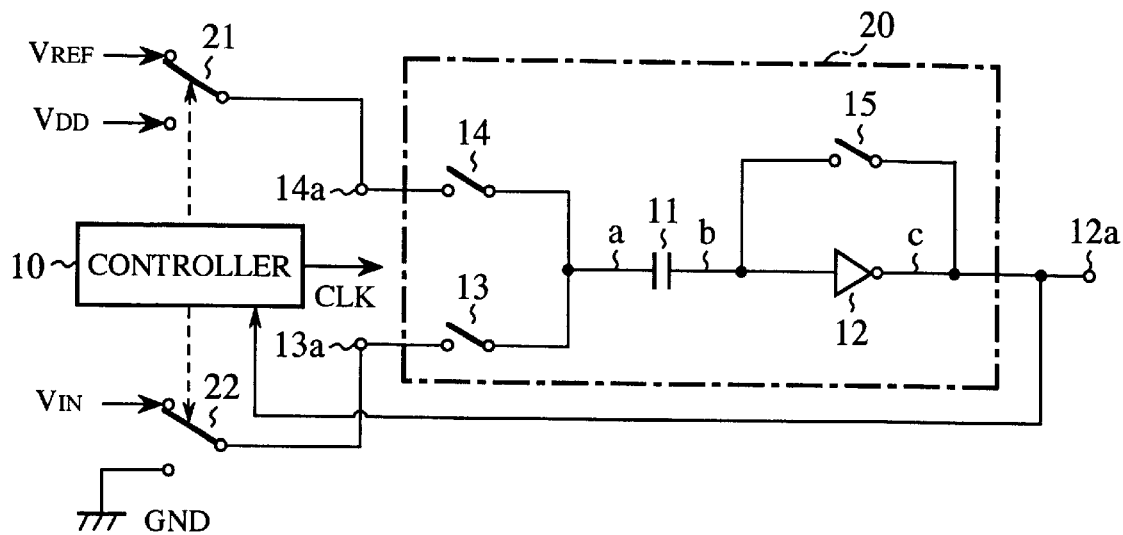
FIG. 1 is a circuit diagram showing a configuration of an embodiment 1 of the chopper type A/D converter in accordance with the present invention.

In FIG. 1, the reference numeral 20 designates a comparator with the same configuration as the comparator shown in FIG. 5, and reference numerals 21 and 22 each designate a selector. The analog switch 14 is connected to the selector 21, and the analog switch 13 is connected to the selector 22. The selectors 21 and 22 are switched by a controller 10 so that the selector 21 supplies the analog switch 14 with one of the reference voltage $V_{REF}$ and the power supply voltage $V_{DD}$, and the selector 22 supplies the analog switch 13 with one of the analog input voltage $V_{IN}$ and ground potential GND.

Next, the operation of the present embodiment 1 will be described with reference to FIGS. 1 and 2.

The comparator 20 operates as the comparator as shown in FIG. 5. When entering the power saving mode, the chopper type A/D converter has the selectors 21 and 22 select the power supply voltage $V_{DD}$ and the ground potential GND, respectively. When the analog switches 13 and 15 are turned on and the analog switch 14 is turned off in this state, the first end of the capacitor 11 (point a) is placed at the ground potential GND as illustrated in FIG. 2(a). On the other hand, since the analog switch 15 conducts, the potential of the second end of the capacitor 11 (the potential at point b) is placed at the threshold voltage $V_{th}$ of the inverter circuit 12 as illustrated in FIG. 2(b). Thus, the capacitor 11 is charged to an amount corresponding to the difference between the ground potential GND and the threshold voltage $V_{th}$. The level at the output side (point C) of the inverter circuit 12 becomes $V_{th}$ in this case. Here, the analog switch (first switch) 13 and analog switch (second switch) 14 operates as a first switching means and the analog switch 15 operates as a second switching means.

Subsequently, when the analog switches 13 and 15 are turned off and the analog switch 14 is turned on, the power supply voltage $V_{DD}$ is applied to the first end of the capacitor 11 (point a). Thus, as illustrated in FIG. 2(a), the input side potential of the capacitor 11 (potential at the point a) rises to the power supply voltage $V_{DD}$. Since the power supply voltage $V_{DD}$ is higher than the ground potential GND, the potential of the second end (point b) of the capacitor 11 rises beyond the threshold voltage $V_{th}$, that is, to $V_{th}+V_{DD}$, as illustrated in FIG. 2(b). As a result, the output of the inverter circuit 12 falls to the low level (ground potential GND) as illustrated in FIG. 2(c).

In this state, since the output side of the inverter circuit 12 is at the ground potential GND, no flow-through current flows through the inverter circuit 12. In addition, since the input side of the inverter circuit is not forcibly grounded in the comparator in the chopper type A/D converter of FIG. 1, that is, since the comparator 20 includes no switch for forcibly grounding the input side of the inverter circuit 12, the present embodiment can solve the problem in that the potential at the input side of the inverter circuit 12 fluctuates because the switch operates as capacitive component. As a result, it can prevent the degradation in the accuracy of the A/D converter.

As described above, in the chopper type A/D converter as shown in FIG. 1, the power saving mode starts when the selectors 21 and 22 select the power supply voltage $V_{DD}$ and ground potential GND, respectively. In other words, a state equivalent to the power saving mode appears when the output side of the inverter circuit 12 is placed at the ground potential, and the clock signal is halted.

Here, when the selector 21 selects the power supply voltage $V_{DD}$, the selector 22 always select the ground potential GND. On the other hand, when the selector 21 selects the reference voltage $V_{REF}$, the selector 22 always selects the analog input voltage $V_{IN}$.

In the power saving mode, the inverter circuit 12 becomes stable in the state where a leakage current flows through the transistors constituting the inverter circuit 12. In this case, the voltage at the input side of the inverter circuit 12 is maintained by the charges stored in the capacitor 11. Ideal transistors that have no leakage current will maintain the voltage at the input side of the inverter circuit 12 at a voltage greater than a predetermined voltage corresponding to the charges stored in the capacitor 11. However, the actual transistors gradually discharge the charges stored in the capacitor 11 because of their very small leakage current. Accordingly, it is unavoidable that the voltage at the input side of the inverter circuit 12 falls below the predetermined voltage.

Considering this, the time period from the beginning of the power saving mode to the time at which the predetermined voltage cannot be maintained (the predetermined time period T) is calculated from the leakage current of the transistors and the amount of the charges the capacitor 11 stores, and a certain amount of charges is stored in the capacitor 11 by activating the A/D converter within the time period T.

The operation will be described in more detail with reference to FIG. 3. By placing the potential of the second end (point b) of the capacitor 11 at $V_{th}+V_{DD}$ (FIG. 3(a)) in the same manner as described in connection with FIG. 2 at timing CLKT1 of the clock signal CLK (FIG. 3(b)), the output side of the inverter circuit 12 is brought to the ground potential GND (FIG. 3(c)). In the same manner, when the prescribed time T has elapsed after charging the capacitor 11, the potential of the second end (point b) of the capacitor 11 is brought to $V_{th}+V_{DD}$ (FIG. 3(b)) again at timing CLKT2 by supplying the clock signal CLK, thereby maintaining the output side of the inverter circuit 12 at the ground potential GND (FIG. 3(c)).

In this way, actuating the A/D converter at every prescribed time T in the power saving mode enables the voltage at the input side of the inverter circuit 12 to be maintained at a value greater than the predetermined voltage.

The feeding control of the clock signal CLK in the power saving mode is carried out by the controller 10. For example, the controller 10 halts supplying the clock signal when the output side of the inverter circuit 12 is grounded, thereby establishing the power saving mode. When the prescribed time T has elapsed from this state, the controller 10 supplies the clock signal CLK, thereby charging the capacitor 11 again.

The controller 10 also carries out the switching control of the selectors 21 and 22. To bring the A/D converter into the power saving mode, the controller 10 controls the selectors 21 and 22 such that the comparator 20 is supplied with the power supply voltage $V_{DD}$ via the selector 21, and with the ground potential GND via the selector 22. Thus, the output side of the inverter circuit 12 is grounded, at which time the clock signal CLK is halted, and the power saving mode is established.

Although the selector 21 selects one of the power supply voltage $V_{DD}$ and reference voltage $V_{REF}$, and the selector 22 selects one of the ground potential GND and analog input voltage $V_{IN}$ in the example as shown in FIG. 1, this is not essential. For example, a configuration is possible in which the selector 21 supplies the ground potential GND to the reference input terminal 14a, and the selector 22 supplies the power supply voltage $V_{DD}$ to the analog input terminal 13a.

In this case, when the analog switches 13 and 15 are turned on and the analog switch 14 is turned off, the first end of the capacitor 11 (point a) is supplied with the power supply voltage $V_{DD}$. At the same time, since the analog switch 15 is ON, the potential of the second end of the capacitor 11 (the potential at point b) is placed at the threshold voltage $V_{th}$ of the inverter circuit 12. Thus, the capacitor 11 is charged to the level corresponding to the difference between the power supply voltage $V_{DD}$ and the threshold voltage $V_{th}$.

Subsequently, when the analog switches 13 and 15 are turned off and the analog switch 14 is turned on, the first end of the capacitor 11 (point a) is placed at the ground potential GND. Since the power supply voltage $V_{DD}$ is higher than the ground potential GND, the potential of the second end (point b) of the capacitor 11 falls to the voltage $V_{th}-V_{DD}$ below the threshold voltage $V_{th}$. As a result, the output of the inverter circuit 12 is brought to the high level (power supply voltage).

In this state, since the output side of the inverter circuit 12 is placed at the power supply voltage, the flow-through current does not flow through the inverter circuit 12, and the accuracy of the A/D converter is not impaired as described above.

As described above, the embodiment 1 is configured such that the output side of the inverter circuit of the comparator is fixed at the ground potential or power supply voltage level in the power saving mode. As a result, the inverter circuit has no flow-through current, and hence can reduce its power consumption.

In addition, since the input side of the inverter circuit is not forcibly grounded by the switch or the like within the comparator, the present embodiment 1 can solve the problem in that the potential at the input side of the inverter circuit 12 fluctuates because the switch operates as capacitive component. As a result, it can prevent the degradation in the accuracy of the A/D converter.

Embodiment 2

Figure 4:
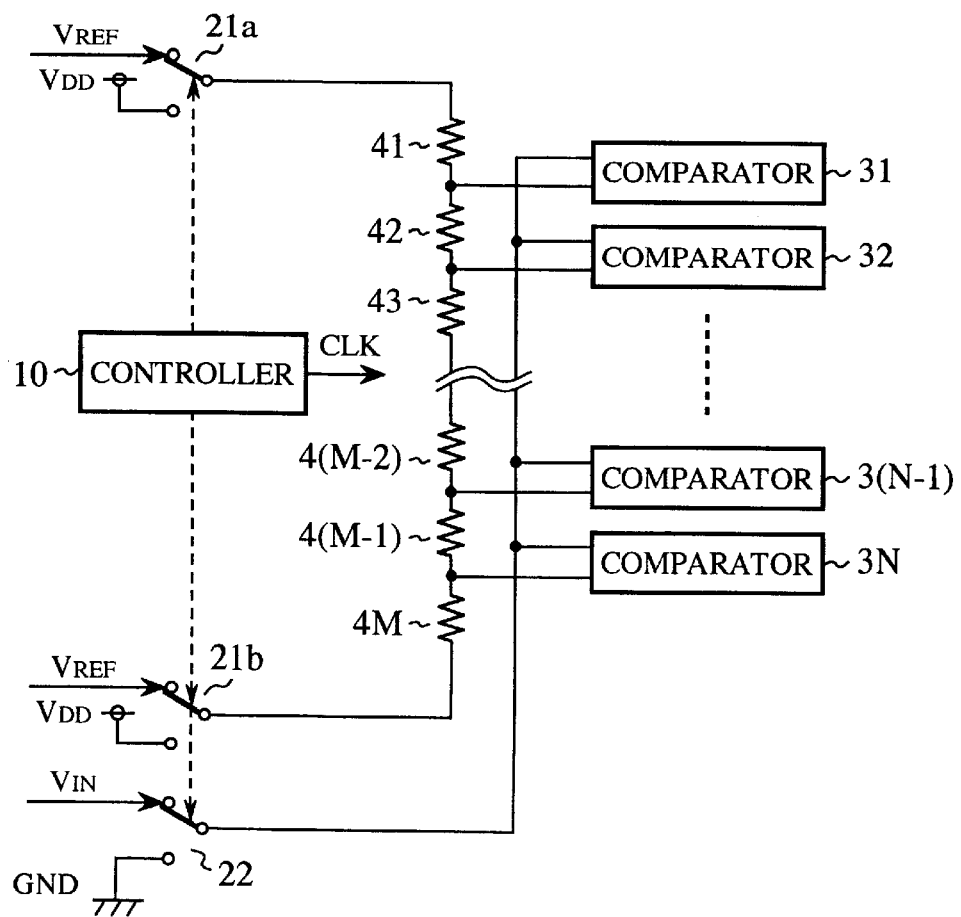
FIG. 4 is a circuit diagram showing a configuration of an embodiment 2 of the chopper type A/D converter in accordance with the present invention.
Figure 8:
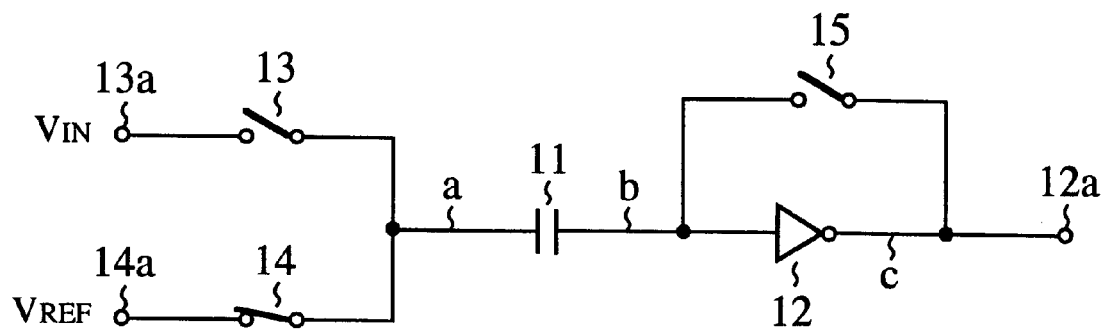
FIG. 8 is a circuit diagram showing ON/OFF control of the switches in the chopper type A/D converter as shown in FIG. 5.
Figure 9:
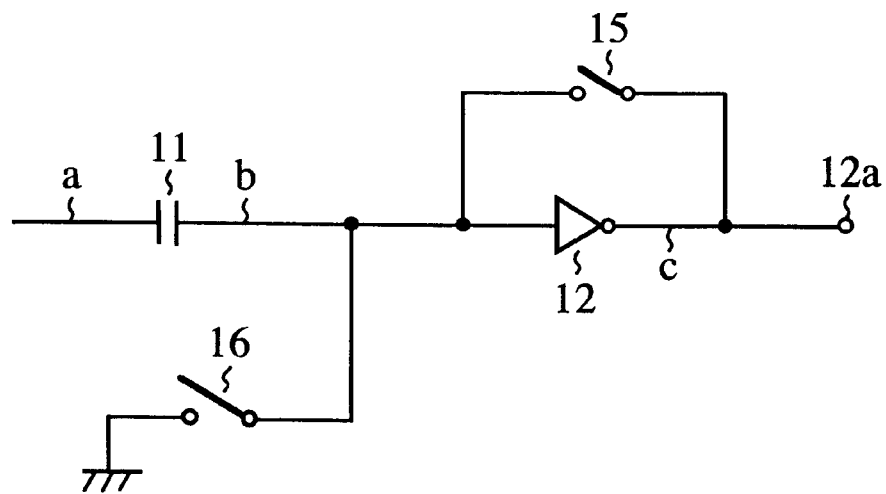
FIG. 9 is a circuit diagram showing an example in which the input side of the inverter circuit of the chopper type A/D converter as shown in FIG. 5 is grounded via a switch.

To actually construct the chopper type A/D converter, a plurality of chopper type comparators are mounted on a single substrate (single chip). FIG. 4 shows an example of the chopper type A/D converter. In FIG. 4, reference numerals 31–3N each designate a comparator, where N is an integer greater than one, and 41–4M (M=N+1) each designate a resistor. The resistors 41–4M are connected in series to form a resistor circuit, and the resistor 41 is connected to a selector 21a. The selector 21a selectively supplies the resistor 41 with the reference voltage $V_{REF}$ or the power supply voltage $V_{DD}$. Likewise, the resistor 4M is connected to the selector 21b which selectively supplies the resistor 4M with the reference voltage $V_{REF}$ or the power supply voltage $V_{DD}$. The comparator 3n, where n is an integer from one to N, is connected to the connecting point of the resistors 4(m−1) and 4m, where m is an integer from two to M. The comparator 3n is selectively supplied with the analog input voltage $V_{IN}$ or the ground potential GND via the selector 22.

The comparators 31–3N each have the same configuration as the comparator 20 as described in connection with FIG. 1. The comparator 3n has its analog input terminal 13a connected to the selector 22, and its reference input terminal 14a connected to the connecting point of the resistors 4(m−1) and 4m. Since the resistors 41–4M have the same resistance, and the resistors 41 and 4M are both supplied with one of the reference voltage $V_{REF}$ and the power supply voltage $V_{DD}$, selectively, the voltage applied to the reference input terminal 14a of each of the comparators 31–3N is the same. Specifically, although the reference input terminals 14a of the comparators 31–3N are supplied with the voltages divided by the resistor circuit, since the resistors 41–4M have the same resistance, and the resistors 41 and 4M are both supplied with either the reference voltage $V_{REF}$ or the power supply voltage $V_{DD}$, the reference input terminals 14a of the individual comparators 31–3N are supplied with the same voltage.

Next, the operation of the present embodiment 2 will be described.

In FIG. 4, the selectors 21a and 21b are linked, and to establish the power saving mode, they are switched to the power supply voltage $V_{DD}$ side, and the selector 22 is switched to the ground potential GND side as described in connection with FIG. 1. The comparators 31–3N have their analog switches switched as was described in connection with FIG. 1, thereby grounding the output side of the inverter circuits, and bringing the A/D converter as shown in FIG. 4 into the power saving mode.

In this case, the controller 10 carries out the control of the clock signal (that is, the switching control of the analog switches in the individual comparators 31–3N), and the control of the selectors 21a, 21b and 22 as described above in connection with FIG. 3. Incidentally, as described above in connection with FIG. 1, the configuration can be modified such that the selectors 21a and 21b supply the comparators 31–3N with the reference voltage $V_{REF}$ or the ground potential GND selectively, and the selector 22 supplies the comparators 31–3N with the analog input voltage $V_{IN}$ or the power supply voltage $V_{DD}$ selectively.

Furthermore, the present embodiment 2 can be modified such that it comprises the selectors 21 and 22 so that the comparators 31–3N are each supplies with one of the reference voltage $V_{REF}$ and power supply voltage $V_{DD}$ via the selector 21, and with one of the analog input voltage $V_{IN}$ and ground potential GND via the selector 22, thereby obviating the need for the resistor circuit.

Thus, the present embodiment 2 as shown in FIG. 4 comprises a plurality of chopper type comparators mounted on a single chip. Accordingly, it can reduce the number of selectors. In addition, since the number of the selectors is small, the variation (performance variation) in the selectors can be reduced in the fabrication process.

As described above, the present embodiment 2 is configured such that the output side of the inverter circuits of the comparators is set at the ground potential or at the power supply voltage in the power saving mode. Therefore, it offers an advantage of being able to prevent the flow-through current from flowing through the inverter circuit, thereby reducing the power consumption.

In addition, since the input side of the inverter circuits is not forcibly grounded by the switch or the like within the comparators, the present embodiment can solve the problem in that the potential at the input side of the inverter circuits fluctuates because the switch operates as a capacitive component. As a result, it can prevent the degradation in the accuracy of the A/D converter.

Moreover, since the plurality of chopper type comparators are mounted on the single chip, it can reduce the number of selectors.

What is claimed is:

1. A chopper type analog-to-digital converter having a comparator that includes an inverter circuit, a capacitor connected to an input terminal of said inverter, first switching means for supplying said capacitor with a reference voltage and an analog input voltage alternately, and second switching means for short-circuiting the input terminal of said inverter and an output terminal of said inverter, and that outputs an inverter output signal from the output terminal of said inverter in response to control of said first and second switching means, said chopper type analog-to-digital converter comprising:

selecting means for supplying, when bringing said comparator into a power saving mode, said first switching means with one of a power supply voltage and a ground potential as the reference voltage, and with the other of the power supply voltage and the ground potential as the analog input voltage; and control means for halting control of said first and second switching means when the inverter output signal is placed at one of the ground potential and the power supply voltage.

2. The chopper type analog-to-digital converter according to claim 1, wherein said first switching means comprises a first switch connected to said capacitor, and a second switch connected to said capacitor;

said selecting means comprises a first selector for selectively supplying said first switch with one of the power supply voltage and the reference voltage, and a second selector for selectively supplying said second switch with one of the ground potential and the analog input voltage; and said control means controls, when bringing said comparator into the power saving mode, said first and said second selector such that they supply said first switch and said second switch with the power supply voltage and the ground potential, respectively.

3. The chopper type analog-to-digital converter according to claim 2, wherein said first switch and said second switch are turned on and off alternately, and said second switching means is turned on and off in response to the ON/OFF control of said first switch and said second switch.

4. The chopper type analog-to-digital converter according to claim 3, wherein said second switch is turned off when said first switch and said second switching means are turned on, and said second switch is turned on when said first switch and said second switching means are turned off.

5. The chopper type analog-to-digital converter according to claim 1, wherein said control means supplies said capacitor with one cycle of the ground potential and the power supply voltage each time a prescribed time has elapsed after starting the power saving mode by controlling said first switching means and said second switching means at predetermined timing.

6. The chopper type analog-to-digital converter according to claim 5, wherein the prescribed time is determined in accordance with a leakage current of transistors constituting said inverter circuit and with an amount of charge said capacitor stores.

7. A chopper type analog-to-digital converter having a plurality of comparators, each of which includes an inverter circuit, a capacitor connected to an input terminal of said inverter, first switching means for supplying said capacitor with a reference voltage and an analog input voltage alternately, and second switching means for short-circuiting the input terminal of said inverter and an output terminal of said inverter, and outputs an inverter output signal from the output terminal of said inverter in response to control of said first and second switching means, said chopper type analog-to-digital converter comprising:

selecting means for supplying, when bringing each of said comparators into a power saving mode, said first switching means with one of a power supply voltage and a ground potential as the reference voltage, and with the other of the power supply voltage and the ground potential as the analog input voltage in each of said comparators; and control means for halting control of said first and second switching means of each of said comparators when the inverter output signal of each of said comparators is placed at one of the ground potential and the power supply voltage.

* * * * *